(12) United States Patent
Ryu et al.

(10) Patent No.: US 7,709,946 B2
(45) Date of Patent: May 4, 2010

(54) MICRO UNIVERSAL SERIAL BUS (USB) MEMORY PACKAGE

(75) Inventors: Ki Tae Ryu, Chungcheongnam-do (KR); Nam Young Cho, Gyeongsangnam-do (KR); Yong An Kwon, Chungcheongnam-do (KR); Hee Bong Lee, Gyeonggi-do (KR)

(73) Assignee: Hana Micron Co., Ltd. (KR)

( * ) Notice: Subject to any disclaimer, the term of this patent is extended or adjusted under 35 U.S.C. 154(b) by 170 days.

(21) Appl. No.: 11/580,495

(22) Filed: Oct. 13, 2006

(65) Prior Publication Data
US 2007/0295982 A1  Dec. 27, 2007

(30) Foreign Application Priority Data
Jun. 27, 2006  (KR) .................. 10-2006-0058209

(51) Int. Cl.
*H01L 23/52* (2006.01)
*H01L 23/48* (2006.01)

(52) U.S. Cl. .................... 257/692; 257/701; 257/724; 257/773; 257/787; 257/E23.012; 257/E23.129

(58) Field of Classification Search ............... 257/79, 257/81, 82, 91, 98–100, 116, 117, 432–437, 257/528, 531–543, 701, 723, 730, 744, 749, 257/787, 685–687, 773, 778, 784, 790, E25.01, 257/E25.011–E25.016, E25.023, E25.031, 257/E23.015, E23.116, E23.123–E23.126, 257/E23.193, E23.175, E23.181, E21.705, 257/E21.662, 679, 690–693, 700, 724, 735, 257/777, 782, E23.002; 439/502, 76.1, 79, 439/377, 607.23, 607.24, 607.27, 607.31, 439/607, 660, 284, 640; 438/689, 718, 58, 438/59, 106, 118, 127; 361/737, 752, 785; 29/829, 858, 877; 710/63, 74, 305, 313; 257/E23.01, E23.012, E23.031, E23.129, 257/E23.132
See application file for complete search history.

(56) References Cited

U.S. PATENT DOCUMENTS

| | | | | |
|---|---|---|---|---|
| 6,538,331 B2 * | 3/2003 | Masuda et al. | ............... | 257/777 |
| 6,552,423 B2 * | 4/2003 | Song et al. | .................. | 257/679 |
| 6,854,984 B1 * | 2/2005 | Lee et al. | ...................... | 439/79 |
| 7,053,471 B2 * | 5/2006 | Wada et al. | .................. | 257/679 |
| 7,069,370 B2 * | 6/2006 | Sukegawa et al. | ........... | 710/305 |
| 7,223,127 B2 * | 5/2007 | Ho | .............................. | 439/660 |
| 7,269,004 B1 * | 9/2007 | Ni et al. | ................. | 361/679.41 |
| 7,270,557 B1 * | 9/2007 | Yu | .............................. | 439/284 |
| 7,337,261 B2 * | 2/2008 | Sukegawa et al. | ........... | 710/313 |

(Continued)

FOREIGN PATENT DOCUMENTS

JP          59009982 A  *  1/1984
WO    WO 2005041120 A1  *  5/2005

*Primary Examiner*—Matthew C Landau
*Assistant Examiner*—Joseph C Nicely
(74) *Attorney, Agent, or Firm*—Reinhart Boerner Van Deuren P.C.

(57) ABSTRACT

A micro USB memory package and method for manufacturing the same, which can meet the USB standard specification, can have a light, thin, short and small configuration, can have various applications, and can simply expand the memory capacity thereof. The micro USB memory package comprises a substrate with a plurality of circuit patterns formed on the top surface thereof, at least one of passive elements connected with the circuit patterns of the substrate, at least one of controllers connected with the circuit patterns of the substrate, at least one of flash memories connected with the circuit patterns of the substrate, and an encapsulation part encapsulating the passive elements, the controllers and the flash memories on the substrate, and at least one of USB lands connected with the circuit patterns by a conducting via are formed on the under surface of one side of the substrate.

12 Claims, 13 Drawing Sheets

U.S. PATENT DOCUMENTS

| | | | |
|---|---|---|---|
| 7,413,470 B1* | 8/2008 | Yu | 439/502 |
| 7,447,037 B2* | 11/2008 | Hiew et al. | 361/737 |
| 7,458,825 B2* | 12/2008 | Atsmon et al. | 439/78 |
| 7,552,876 B2* | 6/2009 | Nishizawa et al. | 235/492 |
| 2001/0011766 A1* | 8/2001 | Nishizawa et al. | 257/685 |
| 2002/0020911 A1* | 2/2002 | Lee et al. | 257/700 |
| 2002/0180060 A1* | 12/2002 | Masuda et al. | 257/777 |
| 2004/0152292 A1* | 8/2004 | Babinetz et al. | 438/617 |
| 2004/0153595 A1* | 8/2004 | Sukegawa et al. | 710/305 |
| 2005/0164532 A1* | 7/2005 | Ni et al. | 439/79 |
| 2005/0181645 A1* | 8/2005 | Ni et al. | 439/79 |
| 2005/0253239 A1* | 11/2005 | Nishizawa et al. | 257/679 |
| 2006/0090334 A1* | 5/2006 | Chen et al. | 29/858 |
| 2006/0170084 A1* | 8/2006 | Masuda et al. | 257/666 |
| 2006/0270105 A1* | 11/2006 | Takiar et al. | 438/106 |
| 2007/0066139 A1* | 3/2007 | Roeper et al. | 439/607 |
| 2008/0017970 A1* | 1/2008 | Yu | 257/693 |
| 2008/0032561 A1* | 2/2008 | Hiew et al. | 439/660 |
| 2008/0092381 A1* | 4/2008 | Moutel et al. | 29/877 |
| 2008/0093720 A1* | 4/2008 | Hiew et al. | 257/679 |
| 2008/0198031 A1* | 8/2008 | Takiar et al. | 340/687 |

* cited by examiner

MICRO UNIVERSAL SERIAL BUS (USB) MEMORY PACKAGE

CROSS-REFERENCE TO RELATED APPLICATIONS

This application claims the benefit of Korean Patent Application No. 2006-0058209, filed on Jun. 27, 2006, in the Korean Intellectual Property Office, the disclosure of which is incorporated herein by reference.

FIELD OF THE INVENTION

The present invention relates to a micro USB memory package and a method for manufacturing the same, and more particularly, to a micro USB memory package and a method for manufacturing the same, which can meet the established USB standard specification, can have light, thin, short and small configuration, can have various applications, and can simply expand the memory capacity thereof.

BACKGROUND OF THE INVENTION

Generally, an USB memory package comprises: a substrate with an USB plug formed on one end thereof; a flash memory electrically connected with the substrate of one end of the USB plug; a controller electrically connected with the substrate of the other end of the USB plug and controlling the flash memory and so on; a passive element electrically connected with the substrate of the other end of the USB plug; and a case coupled with the substrate and protecting the flash memory, the controller and the passive element.

The USB memory package, as is well known, is manufactured and sold in various forms. However, the USB plug commonly assumes the form of being protruded outwardly from the substrate or the case by a certain length. Of course, the USB plug assumes the form of being coupled with an USB receptacle mounted on a computer and so on, and any of the flash memory, the controller or the passive element cannot be mounted on the region on which the USB plug is formed.

Accordingly, the USB plug acts as an obstacle to reduce the size and the weight of a conventional USB memory package. That is, due to the USB plug, it is difficult to reduce the size and the weight of the USB memory package.

Furthermore, according to the conventional USB memory package, in case of the flash memory, a semiconductor package preformed in the form of TSOP (Thin Small Outline Package) or FBGA (Fine Ball Grid Array) is mounted on the substrate, and in case of the controller, a semiconductor package preformed in the form of QFP (Quad Flat Package) or FBGA is mounted on the substrate. Accordingly, since the memory capacity of the conventional USB memory package is already fixed in the form of TSOP or FBGA (In other words, it is not possible to expand the memory capacity.), it is difficult to expand the memory capacity. Moreover, since the already finished semiconductor package is mounted on the substrate, a problem of high manufacturing cost is arisen.

Furthermore, according to the conventional USB memory package, there is a problem that an LED element indicating the operating state is mounted on the substrate and a case should be formed so as to expose the LED element to the outside of the case. Of course, there is also a problem that moisture or a foreign substance can be easily penetrated into a gap between the LED element and the case.

Furthermore, according to the conventional USB memory package, there is a problem that since the USB plug is formed on only one end of the USB memory package, the user has to exactly couple the USB receptacle with the corresponding side of the USB memory package.

SUMMARY OF THE INVENTION

The present invention is conceived to solve the aforementioned problems of the conventional USB memory package. An object of the present invention is to provide a micro USB memory package and a method for manufacturing the same, which make possible to have light, thin, short and small configuration by forming USB lands meeting the USB standard specification on one surface of a substrate instead of removing an USB plug coupled with an USB receptacle, and mounting various kinds of elements on the USB lands.

Another object of the present invention is to provide a micro USB memory package and a method for manufacturing the same, which make possible to maximize the memory capacity and simplify the manufacturing method by mounting a flash memory on the substrate not in the form of a package but in the form of a die, applying a stack technology and a wire bonding technology thereto, mounting a controller and so on in the form of a die, and encapsulating the flash memory and controller by an encapsulant.

Another object of the present invention is to provide a micro USB memory package and a method for manufacturing the same, which make possible to easily see the operating state from the outside and actively prevent the penetration of moisture or an external foreign substance by mounting an LED element on the substrate and encapsulating it together with other elements by a transparent encapsulant.

Another object of the present invention is to provide a micro USB memory package and a method for manufacturing the same, which make possible to couple the micro USB memory package with the receptacle irrespective of the coupling direction by symmetrically forming and arranging USB lands meeting the USB standard specification on one surface of the substrate.

Another object of the present invention is to provide a micro USB memory package and a method for manufacturing the same, which make possible to safely protect the various internal elements from the external mechanical, electrical and chemical environment by encapsulating the substrate and the encapsulation part by means of an external case.

According to a micro USB memory package of the present invention for accomplishing the aforementioned objects, the micro USB memory package comprises a substrate with a plurality of circuit patterns formed on the top surface thereof, at least one of passive elements connected with the circuit patterns of the substrate, at least one of controllers connected with the circuit patterns of the substrate, at least one of flash memories connected with the circuit patterns of the substrate, and an encapsulation part encapsulating the passive elements, the controllers and the flash memories on the substrate, and at least one of USB lands connected with the circuit patterns by a conducting via is formed on the under surface of one side of the substrate.

At least one of the passive elements, the controllers or the flash memories can be connected with the circuit patterns on the top surface corresponding to the USB lands of the substrate.

An LED element can be further connected with the circuit patterns of the substrate.

The encapsulation part can be formed of a transparent material so as to see the LED element from the outside.

At least one of further USB lands can be additionally formed on the under surface of the other side corresponding to the USB lands formed on the under surface of one side of the substrate.

The USB lands formed on one side and the USB lands formed on the other side can be arranged in reverse order with respect to each other, and both USB lands can be interconnected by the circuit patterns and the conducting via.

The controllers can be attached to the substrate by an adhesive and can be connected with the circuit patterns of the top surface of the substrate by a wire.

The flash memories can be attached to the substrate by an adhesive and can be connected with the circuit patterns of the top surface of the substrate by a wire.

At least two of the flash memories can be stacked by the adhesive.

The wire connecting the flash memories with the circuit patterns can be formed by a forward loop mode process or a forward folded loop mode process in which one end of the wire is firstly ball-bonded to the flash memories and the other end of the wire is secondly stitch-bonded to the circuit patterns.

The wire connecting the flash memories with the circuit patterns can be formed by a reverse loop mode process in which one end of the wire is firstly ball-bonded to the circuit patterns and the other end of the wire is secondly stitch-bonded to a conducting bump (stud bump) preformed on the flash memories.

The substrate and the encapsulation part can be coupled with an external case.

The external case can comprise an upper section covering the encapsulation part, a lower section covering the substrate, a side section covering the both side surfaces of the substrate and the encapsulation part, and a rear section covering the rear surfaces of the substrate and the encapsulation part.

The USB lands formed on the substrate can be exposed to the outside by the external case.

According to a method for manufacturing a micro USB memory package of the present invention for accomplishing the aforementioned objects, the method comprises: the step of providing a substrate with at least one of circuit patterns formed on the top surface thereof and connecting at least one of passive elements with the circuit patterns of the substrate; the step of attaching at least one of controllers and flash memories to the top surface of the substrate; the step of connecting the controllers and the flash memories with the circuit patterns of the substrate by a wire; and the step of forming an encapsulation part by encapsulating the passive elements, the controllers, the flash memories and the wire on the substrate by an encapsulant.

At least one of USB lands connected with the circuit patterns by a conducting via can be further formed on the under surface of one side of the substrate.

At least one of the passive elements, the controllers or the flash memories can be connected with the circuit patterns on the top surface corresponding to the USB lands of the substrate.

The wire connecting the flash memories with the circuit patterns can be formed by a forward loop mode process or a forward folded loop mode process in which one end of the wire is firstly ball-bonded to the flash memories and the other end of the wire is secondly stitch-bonded to the circuit patterns.

The wire connecting the flash memories with the circuit patterns can be formed by a reverse loop mode process in which one end of the wire is firstly ball-bonded to the circuit patterns and the other end of the wire is secondly stitch-bonded to a conducting bump preformed on the flash memories.

At least two of the flash memories can be stacked by an adhesive.

BRIEF DESCRIPTION OF THE DRAWINGS

The above and other objects, features and advantages of the present invention will be more apparent from the following detailed description taken in conjunction with the accompanying drawings, in which.

Common reference numerals are used throughout the drawings and the detailed description to indicate the same elements.

DETAILED DESCRIPTION OF THE INVENTION

Hereinafter, preferred embodiments of the present invention will be described with reference to the accompanying drawings.

Figure 1A:
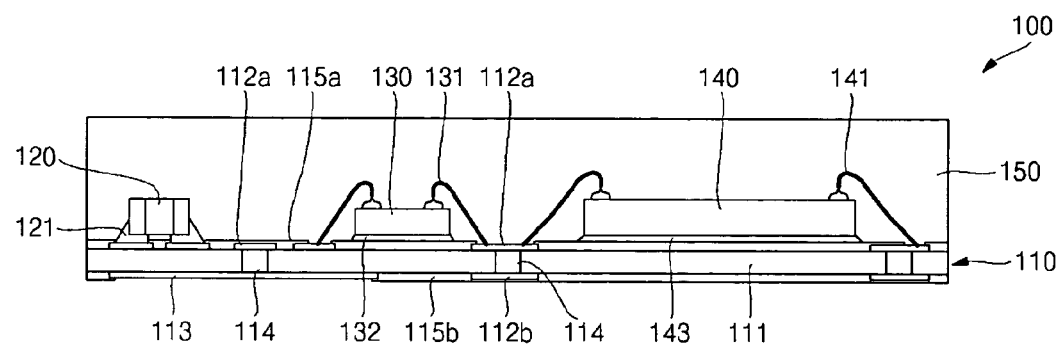
FIGS. 1a and 1b are sectional and bottom views illustrating a micro USB memory package according to an embodiment of the present invention.
Figure 1B:
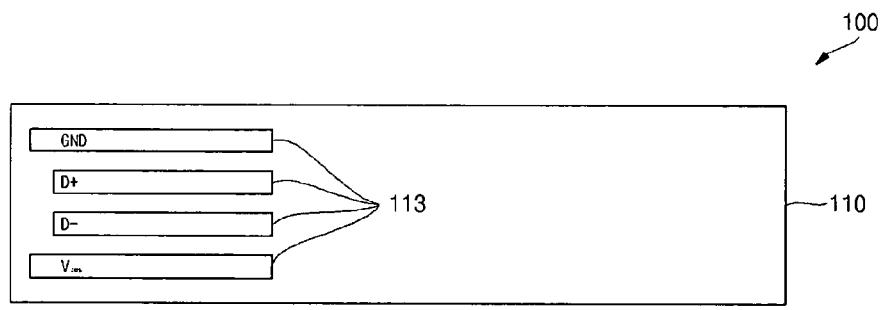

FIGS. 1a and 1b are sectional and bottom views illustrating a micro USB memory package 100 according to an embodiment of the present invention.

As shown in FIG. 1a, a micro USB memory package 100 according to an embodiment of the present invention is characterized in that the micro USB memory package 100 comprises a substrate 110 with a plurality of circuit patterns 112a formed on the top surface thereof, at least one of passive elements 120 connected with the circuit patterns 112a of the substrate 110, at least one of controllers 130 connected with the circuit patterns 112a of the substrate 110, at least one of flash memories 140 connected with the circuit patterns 112a of the substrate 110, and an encapsulation part 150 encapsulating the at least one passive elements 120, the at least one controllers 130 and the at least one flash memories 140 on the substrate 110, and at least one of USB lands 113 connected with the circuit patterns 112a by a conducting via 114 is formed on the under surface of one side of the substrate 110.

A plurality of circuit patterns 112a and 112b are formed on the top and under surfaces of the substrate 110 about an approximately plate-shaped insulating layer 111, and a plurality of USB lands 113, which are electrically connected and disconnected with an USB receptacle (not shown), are formed on one side of the under surface. Of course, the circuit patterns 112a of the top surface and the USB lands 113 of the under surface are electrically interconnected by the conducting via 114. The insulating layer 111 can be selected from typical epoxy resin, polyimide resin, BT (bismalemide triazine) resin, FR-4 (fiberglass reinforced), FR5, ceramic, silicon, glass or their equivalents, but the material of the insulating layer is not limited to these materials thereto. Furthermore, the insulating layer 111 is shown in the drawing as having a single layer structure, but the present invention is not limited thereto. That is, the insulating layer 111 can have multi-layer structure with circuit patterns formed between the layers. The circuit patterns 112a and 112b can be selected from typical copper (Cu), gold (Au), silver (Ag), nickel (Ni), palladium (Pd), metal alloy or their equivalents, but the material of the circuit patterns is not limited to these materials thereto. The USB lands 113 connected with the circuit patterns 112a by the conducting via 114 can also be selected from copper, gold, silver, nickel, palladium, metal alloy or their equivalents, but the material of the USB lands is not limited to these materials thereto. Of course, it is preferred that since the USB lands 113 are exposed to the outside, the surface thereof is plated with gold (Au), so as to prevent the oxidization and minimize the contact resistance. Furthermore, solder masks 115a and 115b (insulating polymer resin) of a predetermined thickness are coated on the surface of the insulating layer 111 and protect the circuit patterns 112a and 112b, and the USB lands 113 are exposed to the outside through the solder masks. Of course, a certain area of the circuit patterns 112a is exposed to the outside through the solder mask 115a for electrical connection of the at least one passive elements 120, the at least one controllers 130 or the at least one flash memories 140.

The at least one passive elements 120 are electrically connected with the circuit patterns 112a formed on the top surface of the substrate 110. For example, the at least one passive elements 120 are soldered to the circuit patterns 112a. These passive elements 120 may be a resistor, inductor or capacitor, but they are not limited thereto. Furthermore, the at least one passive elements 120 are connected to an area corresponding to the USB lands 113. That is, the passive elements 120 are formed on the top surface corresponding to the USB lands 113 formed on the under surface of the substrate 110, and thus the size of the micro USB memory package 100 is reduced as compared to the prior art. Of course, the controllers 130 or the flash memories 140 can be electrically connected with the top surface of the substrate 110 corresponding to the USB lands 113. In other words, no elements could be formed on the region corresponding to a USB plug in the prior art. However, according to the present invention, the size of the micro USB memory package 100 can be reduced as compared to the prior art by forming the USB lands 113 on the under surface of the substrate 110 and connecting various kinds of elements (the passive elements 120, the controllers 130 or the flash memories 140) to the top surface of the substrate 110 corresponding to the USB lands 113.

The controllers 130 are attached to the top surface of the substrate 110 by an adhesive 132 and electrically connected with the circuit patterns 112a formed on the top surface by a wire 131. As is generally known, these controllers 130 control the communication between a computer having a receptacle and the micro USB memory package 100, and control the operation of reading, deleting or writing the data from the flash memories 140. The controllers 130 assume the form of a package, such as TSOP or FBGA, in the prior art. However, the controllers 130 of the present invention assume the form of a semiconductor die. That is, the controllers 130 are attached in the form of the die to the top surface of the substrate 110 by the adhesive 132 and are bonded by the wire 131.

The flash memories 140 are also attached to the top surface of the substrate 110 by an adhesive 143 and electrically connected with the circuit patterns 112a formed on the top surface by a wire 141. As is generally known, these flash memories 140 are storage devices capable of storing a predetermined data. Furthermore, the flash memories 140 assume the form of a package, such as QFP or FBGA, in the prior art, however, the flash memories of the present invention assume the form of a semiconductor die. That is, the flash memories 140 are attached in the form of the die to the top surface of the substrate 110 by the adhesive 143 and are bonded by the wire 141. Here, the wires 131 and 141 connecting the controllers 130 and flash memories 140 with the circuit patterns 112a can be selected from typical gold wire, copper wire, aluminum wire or their equivalents, but the material of the wires is not limited thereto. Of course, the controllers 130 and the flash memories 140 can be connected with the substrate 110 in the form of a flip chip by the wire as well as a solder bump or a gold bump, etc, but the form of the electrical connection between the controllers 130 and the flash memories 140 and the substrate 110 is not limited thereto.

The encapsulation part 150 encapsulates the passive elements 120, the controllers 130, the flash memories 140 and the wires 131 and 141 on the substrate 110 so as to protect them against the external environment. Here, the width of the encapsulation part 150 is nearly the same as the width of the substrate 110. The encapsulation part 150 can be selected from typical epoxy resin, silicon resin or their equivalents, but the material of the encapsulant is not limited thereto. Anyway, whichever encapsulant may be used to encapsulate the passive elements 120, the controllers 130, the flash memories 140 and the wires 131 and 141 on the substrate 110, they can be completely encapsulated, and thus external moisture or foreign substance cannot be penetrated into them. Furthermore, since the encapsulation part 150 is formed with a predetermined thickness and has a relatively high stiffness, the stiffness of the micro USB memory package 100 is also improved as compared to the prior art.

Meanwhile, as shown in FIG. 1b, the USB lands 113 can be collectively formed on one side of the under surface of the substrate 110. Practically, the USB lands 113 have the same design as that formed on the inside of the conventional USB plug, and thus they meet the USB standard specification. For example, there may be GND, D+, D−, Vbus terminals from the above in the drawing. Of course, differently from the prior art, the passive elements 120, the controllers 130 or the flash memories 140 can be formed on the substrate 110 above the USB lands 113, and thus the micro USB memory package 100 can be formed to have light, thin, short and small configuration. Furthermore, the controllers 130 and the flash memories 140 can be mounted on the substrate 110 not in the form of a package but in the form of a semiconductor die, and thus excellent memory expandability, for example, can be accomplished.

Figure 2:
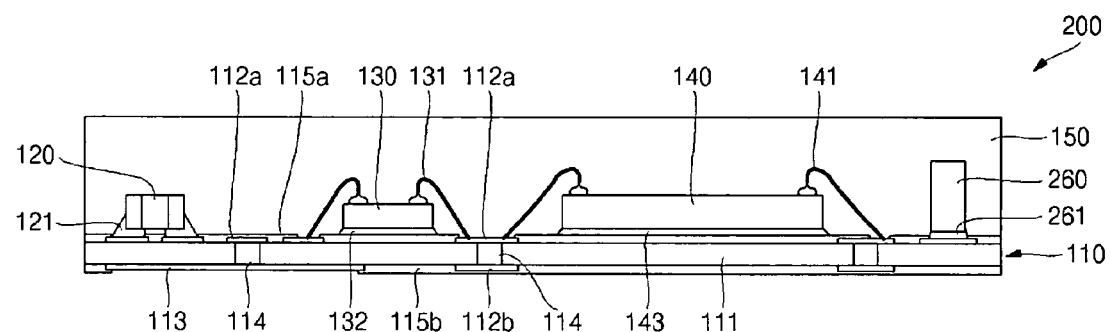
FIG. 2 is a sectional view illustrating a micro USB memory package according to another embodiment of the present invention.

FIG. 2 is a sectional view illustrating a micro USB memory package 200 according to another embodiment of the present invention.

As shown in the drawing, the micro USB memory package 200 according to another embodiment of the present invention is almost identical with the aforementioned micro USB memory package 100. Accordingly, only the difference between the micro USB memory package 200 and the micro USB memory package 100 will be described hereinafter.

As shown in FIG. 2, an LED element 260 can be further connected with the circuit patterns 112a formed on the top surface of the substrate 110 by a solder 261. As is generally known, the LED element 260 serves for indicating the operating state of the micro USB memory package 100 to the user.

Here, the LED element 260 is also in the form of being completely encapsulated by the encapsulation part 150. Accordingly, in case that the encapsulation part 150 is formed by a black encapsulant, the user cannot see the operating state of the LED. Accordingly, the encapsulation part 150 is formed by a transparent encapsulant in the present invention. As is generally known, the transparent encapsulant can be formed by a transparent epoxy encapsulant for a light emitting diode or its equivalent, but the material of the transparent encapsulant is not limited thereto. Of course, although there is exemplarily illustrated in the drawing that all of the encapsulation part 150 is formed by the transparent encapulant, the transparent encapsulant can be applied only to the peripheral portion of the LED element 260. That is, since a semiconductor integrated circuit, such as typical controllers 130 or the flash memories 140, is reacted to a light and thus its property can be deteriorated, the semiconductor integrated circuit can be encapsulated by the black encapsulant and only the LED element 260 can be encapsulated by the transparent encapsulant.

Figure 3A:
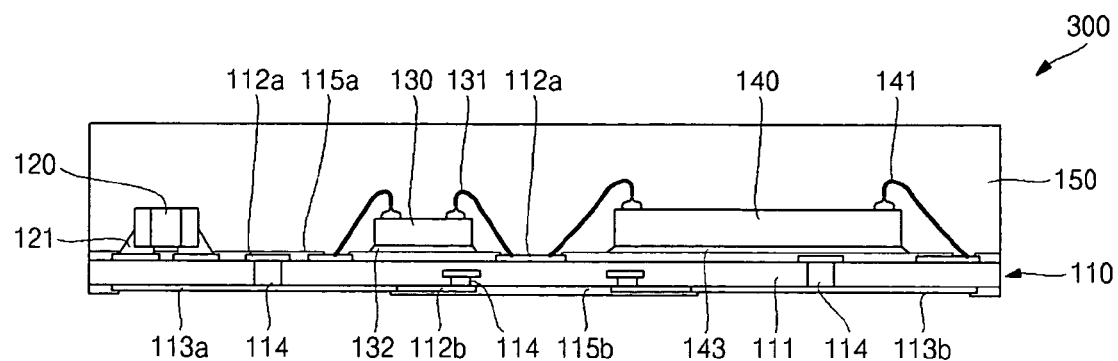
FIGS. 3a and 3b are sectional and bottom views illustrating a micro USB memory package according to another embodiment of the present invention.
Figure 3B:
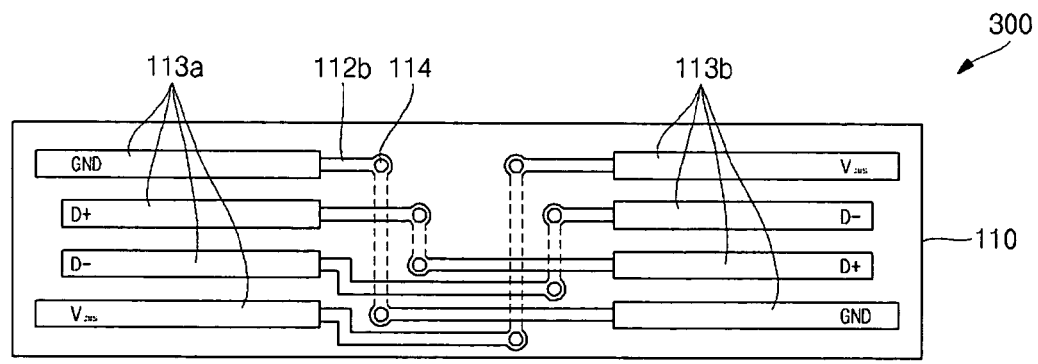

FIGS. 3a and 3b are sectional and bottom views illustrating a micro USB memory package 300 according to another embodiment of the present invention.

As shown in the drawings, the micro USB memory package 300 according to another embodiment of the present invention is almost identical with the aforementioned micro USB memory package 100. Accordingly, only the difference between the micro USB memory package 300 and the micro USB memory package 100 will be described hereinafter.

As shown in FIGS. 3a and 3b, according to the micro USB memory package 300 of another embodiment of the present invention, at least one of further USB lands 113b (right portion of the drawing) is additionally formed on the under surface of the other side corresponding to the USB lands 113a (left portion of the drawing; which are the same as those illustrated in FIGS. 1a and 1b) formed on the under surface of one side of the substrate 110. For example, as shown in FIG. 3b, GND, D+, D− and Vbus form USB lands 113a from the top of the left portion of the drawing, while Vbus, D−, D+ and GND form USB lands 113b from the top of the right portion of the drawing. In this way, whichever directions the micro USB memory package 100 according to the present invention is coupled with the USB receptacle 500, the micro USB memory package can be normally operated. Of course, for this purpose, the left USB lands 113a and the right USB lands 113b should be interconnected in somewhat complex way.

That is, the USB lands 113a and 113b formed on the under surfaces of one side (left portion) and the other side (right portion) of the substrate 110 are electrically interconnected by the circuit patterns 112b and the conducting via 114. For example, the GND of the left USB lands 113 is connected with the GND of the right USB lands 113b by the circuit patterns 112b and the conducting via 114. The left D+, D− and Vbus are alternately connected with the right D+, D− and Vbus by the circuit patterns 112b and the conducting via 114 in the same way as stated above.

Figure 4A:
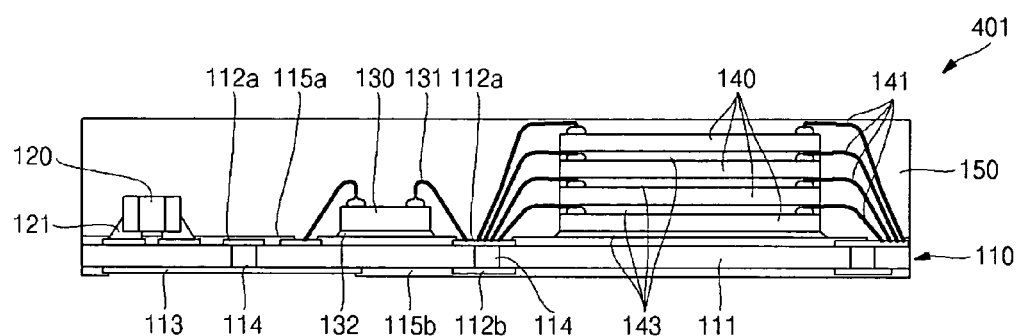
FIGS. 4a and 4b are sectional views illustrating a micro USB memory package according to another embodiment of the present invention.
Figure 4B:
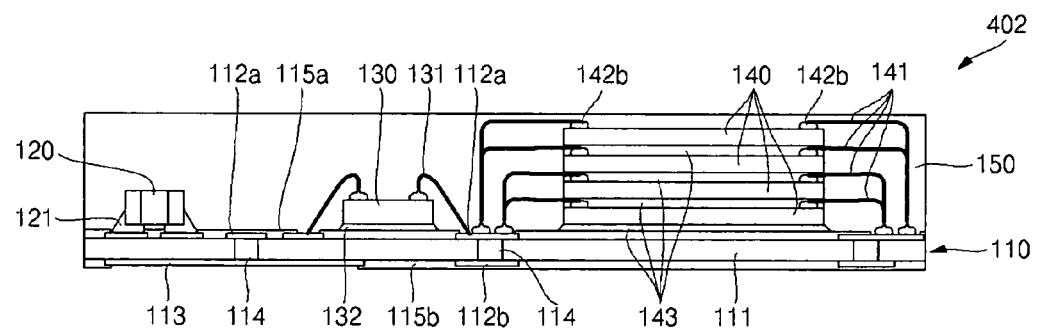

FIGS. 4a and 4b are sectional views illustrating micro USB memory packages 410 and 402 according to another embodiment of the present invention.

As shown in the drawings, the micro USB memory packages 401 and 402 are almost identical with the aforementioned micro USB memory package 100. Accordingly, only the difference between the micro USB memory packages 401 and 402 and the micro USB memory package 100 will be described hereinafter.

As shown in FIGS. 4a and 4b, at least two of the flash memories 140 are stacked by the adhesive 143, and all of the flash memories 140 are electrically connected with the substrate 110 by the wire 141. Although there is illustrated in the drawing that four flash memories 140 are stacked, the number of the flash memories to be stacked is more or less than four. In this way, the expansion of the memory capacity is facilitated.

Meanwhile, the structure of the micro USB memory package 401 of FIG. 4a is somewhat different from that of the micro USB memory package 402 of FIG. 4b. Considering the manufacturing cost, the micro USB memory package 401 of FIG. 4a is preferred, however, considering the reliability and workability, the micro USB memory package 402 of FIG. 4b is preferred. The difference between the micro USB memory packages 401 and 402 of FIGS. 4a and 4b will be described hereinafter.

In the micro USB memory package 401 of FIG. 4a, the wire 141 connecting the plurality of flash memories 140 to the circuit patterns 112a of the substrate 110 is formed in a forward folded loop mode process. That is, one end of the wire 141 is firstly ball-bonded to the flash memories 140 and then is outwardly folded to minimize the loop height, and the other end of the wire is secondly stitch-bonded to the circuit patterns 112a. There is an advantageous effect for the manufacturing cost that the flash memories 140 can be electrically connected with the substrate 110 by controlling a capillary track without employing a separate structure or method. However, since the wire 141 has a certain degree of stiffness in practice, it is difficult to control the capillary track of a wire bonder. Anyway, after the wire 141 of a first flash memory 140 is bonded to the substrate 110, a second flash memory 140 is attached and stacked thereon and then wire-bonded. Of course, the insulating adhesive 143 (or adhesive film) is interposed between the first flash memory 140 and the second flash memory 140.

Here, the controllers 130 are also connected with the substrate 110 by the wire 131. This is carried out by firstly ball-bonding one end of the wire 131 to the controllers 130 and secondly stitch-bonding the other end of the wire to the circuit patterns 112a. This type of ball-bonding is also called as a normal wire bonding.

Furthermore, in the micro USB memory package 402 of FIG. 4b, the wire 141 connecting the plurality of flash memories 140 to the circuit patterns 112a of the substrate 110 is formed in a reverse loop mode process. That is, one end of the wire 141 is firstly ball-bonded to the circuit patterns 112a of the substrate 110, and then the other end of the wire is secondly stitch-bonded to a conducting bump 142b preformed on the flash memories 140. Here, the conducting bump 142b should be preformed on the flash memories 140 as stated above. The conducting bump 142b can be formed in various ways and may be, for example, a solder bump, an Au stud bump, an Au plated bump, etc. The solder bump or Au plated bump can be formed in a wafer state, and the stud bump can be formed by the capillary of the wire bonder during the ball-bonding process of the wire. That is, the stud bump can be formed by cutting the wire immediately after the ball-bonding process of the wire. In the reverse loop mode process, the conducting bump 142b should be preformed on the flash memories 140, and thus the manufacturing cost tends to be increased, but the reliability and the workability are improved. Anyway, after the wire bonding of the first flash memory 140 is completed, the second flash memory 140 is attached and stacked thereon and then wire-bonded. Of course, the insulating adhesive 143 (or adhesive film) is interposed between the first flash memory 140 and the second flash memory 140.

Figure 5A:
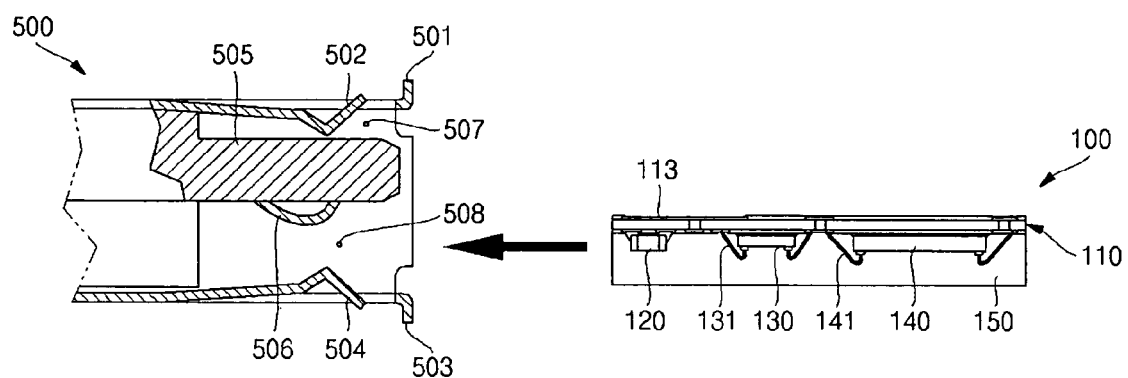
FIGS. 5a and 5b are sectional views illustrating the coupling state of a micro USB memory package according to the present invention with a receptacle.
Figure 5B:
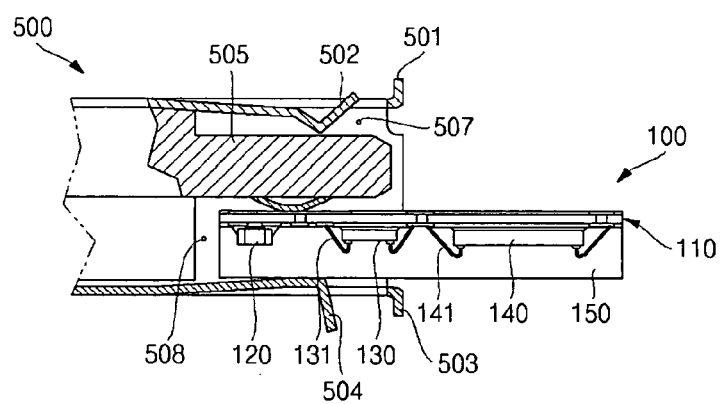

FIGS. 5a and 5b are sectional views illustrating the coupling state of the micro USB memory package 100 according to the present invention with a receptacle 500.

As shown in the drawings, the receptacle 500, which is mounted on a computer, etc., is provided between an upper metal case 501 and a lower metal case 503 with an insulating protrusion 505 protruded by a certain length, and a plurality of USB contacts 506 are formed on the under surface of the insulating protrusion 505. Of course, elastic retaining projections 502 and 504 are formed on the upper metal case 501 and the lower metal case 503 so that the connected micro USB memory package 100 cannot be easily separated to the outside. Furthermore, predetermined spaces 507 and 508 are formed between the upper metal case 501 and the insulating protrusion 505 and between the lower metal case 503 and the insulating protrusion 505. Typically, the space 508 formed between the lower metal case 503 and the insulating protrusion 505 is larger than the space 507 formed between the upper metal case 501 and the insulating protrusion 505.

Meanwhile, differently from the prior art, all of the micro USB memory package 100 according to the present invention is coupled to the space 508 between the lower metal case 503 and the insulating protrusion 505. Of course, in the aforementioned connected state, the plurality of USB lands 113 provided on the USB memory package 100 is connected with the plurality of USB contacts 506 provided on the receptacle 500. Furthermore, as stated above, since the passive elements 120, the controllers 130 or the flash memories 140 are also positioned in a predetermined region of the substrate 110 corresponding to the USB lands 113, the entire width and the thickness of the micro USB memory package 100 are very small as compared to the prior art. That is, according to the prior art, since the micro USB memory package 100 is inserted into the space 508 between the lower metal case 503 and the insulating protrusion 505 as well as the space 507 between the upper metal case 501 and the insulating protrusion 505, the length and the thickness thereof are much larger than those of the micro USB memory package 100 according to the present invention.

Furthermore, only the coupling state of the micro USB memory package 100 with the receptacle 500 is illustrated in the drawings, however, all of the micro USB memory packages 200, 300, 401 and 402 can be coupled and separated in practice.

Figure 6A:
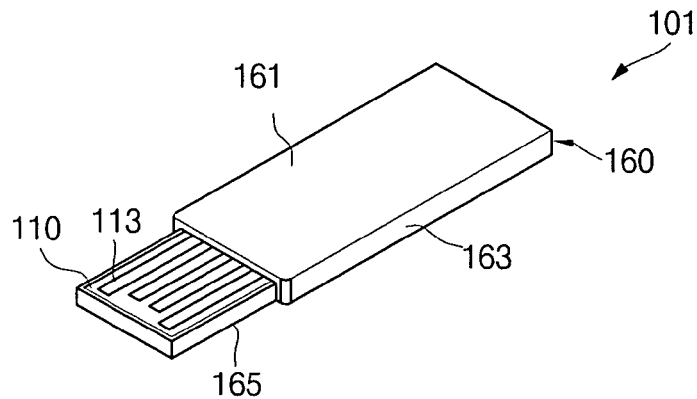
FIG. 6a is a perspective view illustrating a micro USB memory package according to another embodiment of the present invention.
Figure 6B:
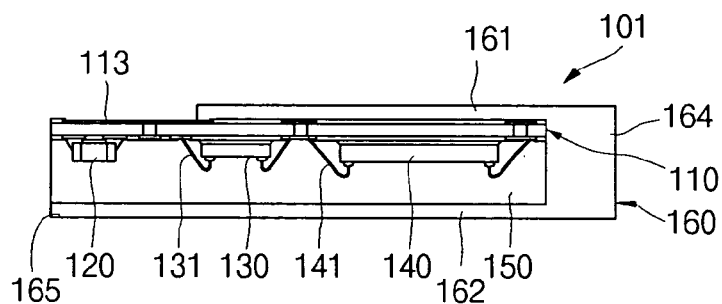
FIG. 6b is a cross sectional view of FIG. 6a and FIG. 6c is a sectional view illustrating the coupling state of the micro USB memory package of FIG. 6a with a receptacle.
Figure 6C:
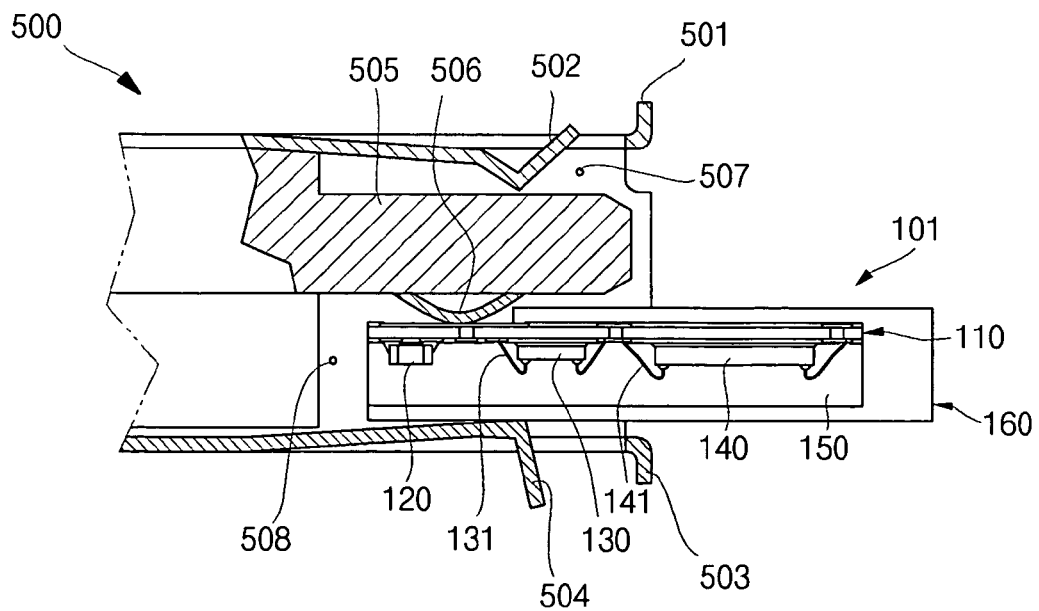

FIG. 6a is a perspective view illustrating a micro USB memory package according to another embodiment of the present invention, FIG. 6b is a cross sectional view of FIG. 6a and FIG. 6c is a sectional view illustrating the coupling state of the micro USB memory package of FIG. 6a with a receptacle.

As shown in the drawings, the micro USB memory package 101 is almost identical with the aforementioned micro USB memory package 100. Accordingly, only the difference between the micro USB memory packages 101 and the micro USB memory package 100 will be described hereinafter.

As shown in FIGS. 6a and 6b, the substrate 110 and the encapsulation part 150 are covered with an external case 160. The external case 160 can comprise an upper section 161 covering the top surface of the encapsulation part 150, a lower section 162 covering the substrate 110, a side section 163 covering the both side surfaces of the substrate 110 and the encapsulation part 150, and a rear section 164 covering the rear surfaces of the substrate 110 and the encapsulation part 150. Furthermore, the external case 160 can be formed by typical resin, metal or their equivalents, but the material of the external case is not limited thereto. The micro USB memory package according to the present invention can be protected from the external environment more effectively by the external case 160.

Furthermore, a partial section of the external case 160, which is a section corresponding to the USB lands 113 formed on the substrate 110, is opened. In other words, the USB lands 113 formed on the substrate 110 can be exposed to the outside through the external case 160. Accordingly, the micro USB memory package 101 can also be easily coupled with the receptacle.

Specifically, as shown in FIG. 6c, the micro USB memory package 101 according to the present invention can be mechanically coupled and electrically connected with the receptacle 500. More specifically, the micro USB memory package 101 is coupled to the space 508 between the insulating protrusion 505 and the lower metal case 503. Of course, in the aforementioned coupled state, the plurality of USB lands 113 provided on the micro USB memory package 101 are electrically connected with the plurality of USB contacts 506 provided on the receptacle 500. Of course, the micro USB memory package 101 coupled with the receptacle 500 cannot be easily separated to the outside by the elastic retaining projection 504.

Meanwhile, the external case 160 coupled with the micro USB memory package 100 is exemplarily described, but the external case 160 can be coupled with and separated from all of the micro USB memory packages 200, 300, 401 and 402.

Figure 7:
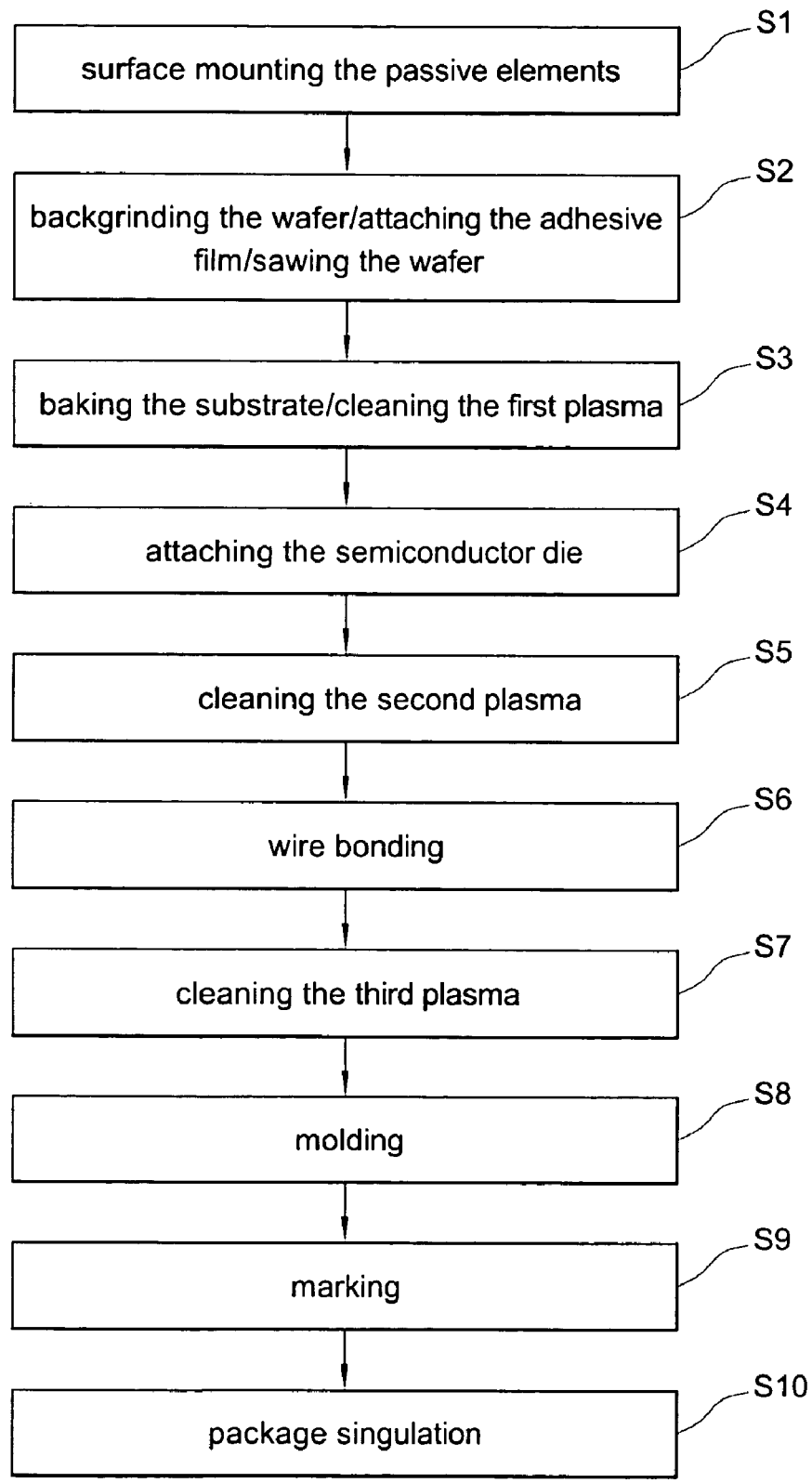
FIG. 7 is a flow chart illustrating a method for manufacturing a micro USB memory package according to the present invention.

FIG. 7 is a flow chart illustrating a method for manufacturing the micro USB memory packages 401 and 402 according to the present invention. Of course, since a method for manufacturing the micro USB memory packages 100, 200 and 300 is similar to the method for manufacturing the micro USB memory packages 401 and 402, the explanation about the method for manufacturing the micro USB memory packages 100, 200 and 300 will be omitted.

As shown in FIG. 7, a method for manufacturing the micro USB memory packages 401 and 402 according to the present invention comprises: the step of surface mounting the passive elements S1; the step of backgrinding the wafer/attaching the adhesive film/sawing the wafer S2; the step of baking the substrate/cleaning the first plasma S3; the step of attaching the semiconductor die S4; the step of cleaning the second plasma S5; the step of wire bonding S6; the step of cleaning the third plasma S7; the step of molding S8; the step of marking S9; and the step of package singulation S10.

Here, the step of baking the substrate/cleaning the first plasma S3, the step of cleaning the second plasma S5 and the step of cleaning the third plasma S7 are processes for drying at a high temperature or removing various organic matters by a plasma gas so as to improve the product reliability and the adhesive strength, and can be skipped or omitted according to circumstances. Accordingly, the explanation about the aforementioned processes will be omitted.

FIGS. 8a to 8g are sequential schematic views illustrating a method for manufacturing the micro USB memory packages 401 and 402 according to the present invention. With reference to the drawings, a method for manufacturing the micro USB memory packages 401 and 402 according to the present invention will be described sequentially.

Figure 8A:
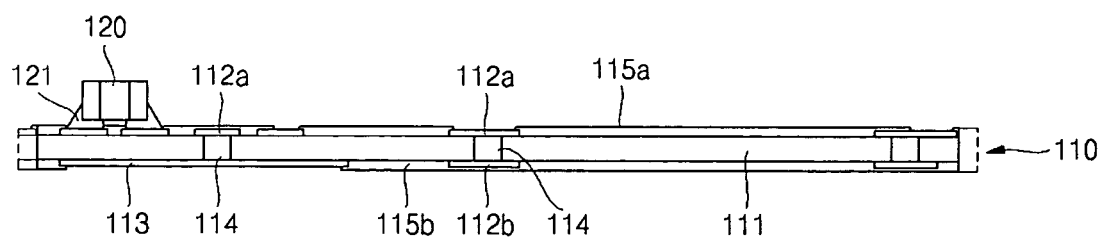
FIGS. 8a to 8g are sequential schematic views illustrating a method for manufacturing a micro USB memory package according to the present invention.

As shown in FIG. 8a, the step of surface mounting the passive elements S1 is performed. In the step S1, after providing the substrate 110, which is provided on the top and under surfaces thereof with the plurality of circuit patterns 112a and 112b and on one side of the under surface thereof with the plurality of USB lands 113, at least one of passive elements 120 are mounted on the circuit patterns 112a formed on the substrate. For example, after screen-printing of a solder paste 121 (Sn/Pb or lead free solder) to the circuit patterns 112a of the substrate 110, the passive elements 120 are mounted on the circuit patterns. Then, the substrate 110 is introduced into a high temperature (150~250° C.) furnace and is refluxed and cooled, and thus the passive elements 120 are rigidly connected with the substrate 110. Of course, thereafter, the remainder of the solder paste 121 is properly classified according to its fat-soluble or water-soluble property and is cleaned. By means of the aforementioned cleaning operation, the wire is accurately bonded to the circuit patterns during the wire bonding operation. Meanwhile, at this time, it is important that the passive elements 120, the controllers 130 or the flash memories 140 are electrically connected with the top region corresponding to the USB lands 113 provided on the substrate 110. That is, a predetermined element can also be mounted on the region corresponding to the USB lands 113 without wasting the space due to the USB plug as in the prior art, and thus the micro USB memory package having light, thin, short and small configuration is realized.

Figure 8B:
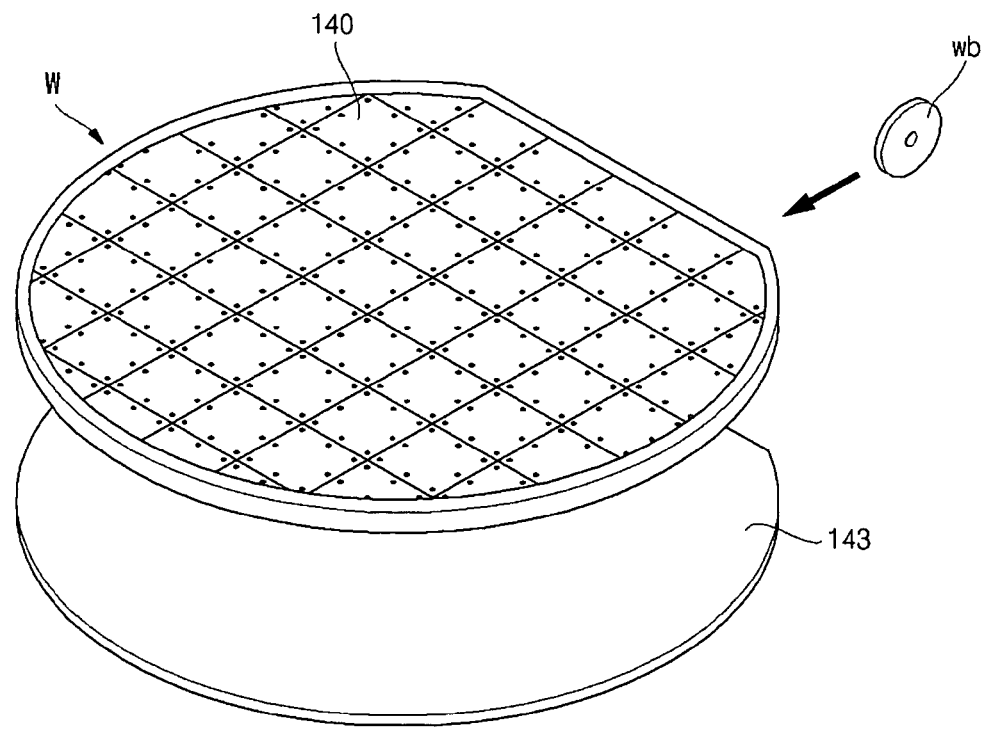

Thereafter, as shown in FIG. 8b, the step of backgrinding the wafer/attaching the adhesive film/sawing the wafer S2 is performed. The process for backgriding the wafer is a process for grinding and polishing the rear surface of the wafer W so as to make the thickness of the wafer thin. Furthermore, the process for attaching the adhesive film 143 is a process for attaching the adhesive (adhesive film) 143 so as to easily stack two or more layers of the semiconductor die. Finally, the process for sawing the wafer is a process for separating each semiconductor die (the controller 130 or the flash memory 140) to each piece using a diamond blade wb, etc. At this time, the adhesive 143 is attached to the under surface of each semiconductor die. Hereinafter, the semiconductor die is defined as the controller 130 or the flash memory 140.

Figure 8C:
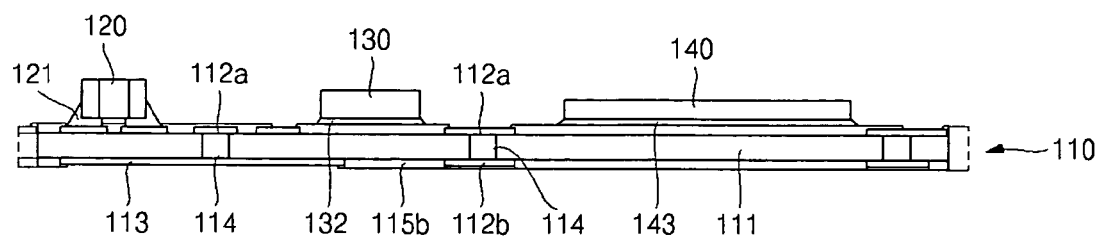

Thereafter, as shown in FIG. 8c, the step of attaching the semiconductor die S4 is performed. That is, the controllers 130 and the flash memories 140 are attached to the top surface of the substrate 110 by the adhesives 143 and 132. Of course, instead of the adhesives 143 and 132, typical adhesive film can be used.

Figure 8D:
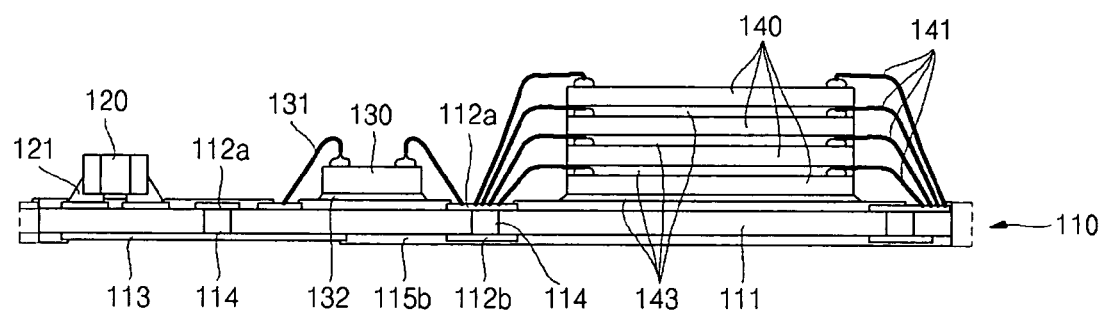

Thereafter, as shown in FIG. 8d, the step of wire bonding S6 is performed. That is, the controllers 130 and the circuit patterns 112a of the substrate 110 are interconnected by the wire 131, and the flash memories 140 and the circuit patterns 112a of the substrate 110 are interconnected by the wire 141. Here, a plurality of flash memories 140 can be stacked, and in order to stack the flash memories 140, a wire bonding process can be performed by a forward loop mode process, a forward folded loop mode process or a reverse loop mode process.

According to the forward loop mode process, one end of the wire 141 is firstly ball-bonded to the flash memories 140 and then is outwardly folded to have a predetermined loop, and the other end of the wire is secondly stitch-bonded to the circuit patterns 112a.

According to the forward folded loop mode process, one end of the wire 141 is firstly ball-bonded to the flash memories 140 and then is outwardly folded to minimize the loop height, and the other end of the wire is secondly stitch-bonded to the circuit patterns 112a. This process will be described in more detail.

According to the reverse loop mode process, one end of the wire 141 is firstly ball-bonded to the circuit patterns 112a, and then the other end of the wire is secondly stitch-bonded to the conducting bump 142b preformed on the flash memories 140. This process will also be described in more detail.

Meanwhile, there is illustrated in the drawing a state where the wire 141 is bonded by the forward folded loop mode process.

Figure 8E:
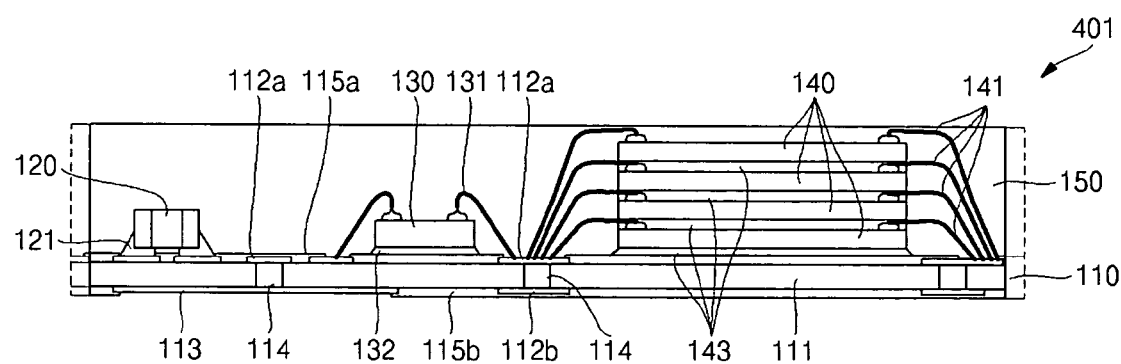

Thereafter, as shown in FIG. 8e, the step of molding S8 is performed. In the step of molding S8, the passive elements 120, the controllers 130, at least one of flash memories 140 and the wires 131 and 141 on the substrate 110 are encapsulated by the encapsulant, such as an epoxy resin or a silicon resin, and thus the encapsulation part 150 of a predetermined shape is formed. Of course, the encapsulation part 150 can be formed by a molding process using a transfer mold or an encapsulation process using a dispenser.

Figure 8F:
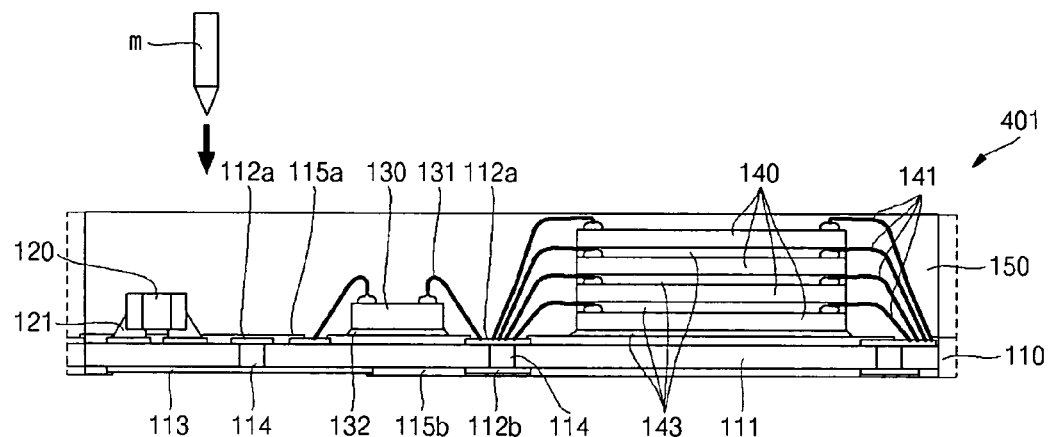

Thereafter, as shown in FIG. 8f, the step of marking S9 is performed. In the step of marking S9, various information, such as the product name and the manufacturing company, is marked on the surface of the encapsulation part 150 using a marking element m, such as ink or laser.

Figure 8G:
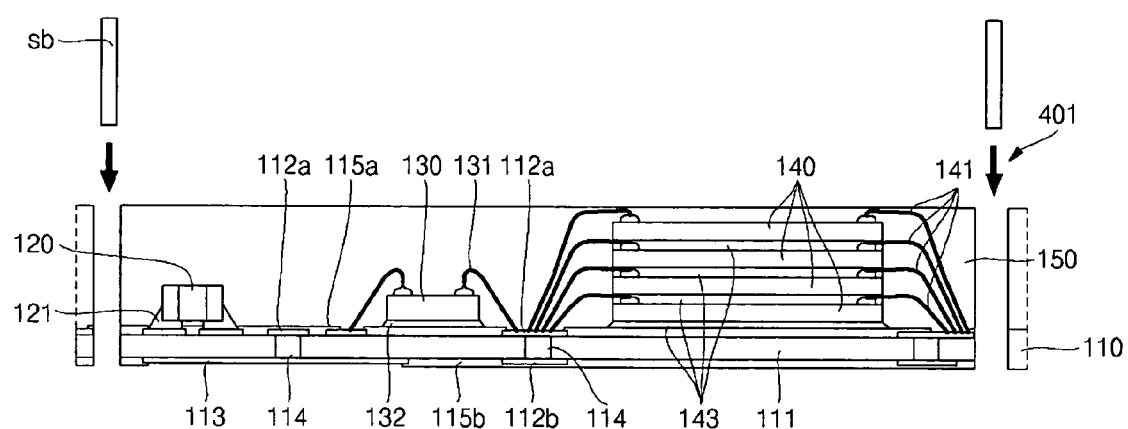

Finally, as shown in FIG. 8g, the step of singulation S10 is performed. In the step of singulation S10, the encapsulation part 150 and the substrate 110 are cut together by a sawing punch or a sawing blade sb, etc., and thus each micro USB memory package 100 is obtained.

Figure 9A:
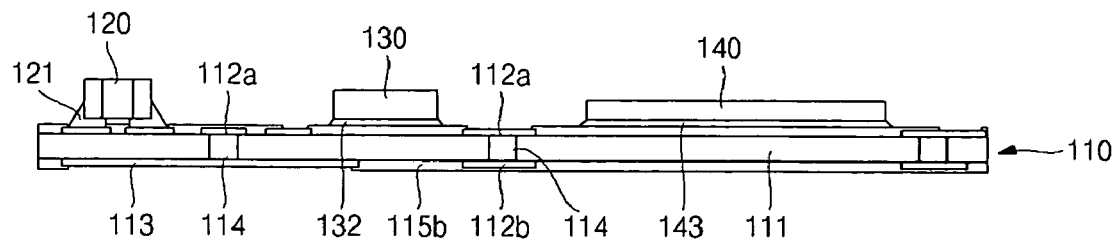
FIGS. 9a to 9c are schematic views illustrating a wire bonding method using a forward loop mode process or a forward folded loop mode process among methods for manufacturing a micro USB memory package according to the present invention.
Figure 9B:
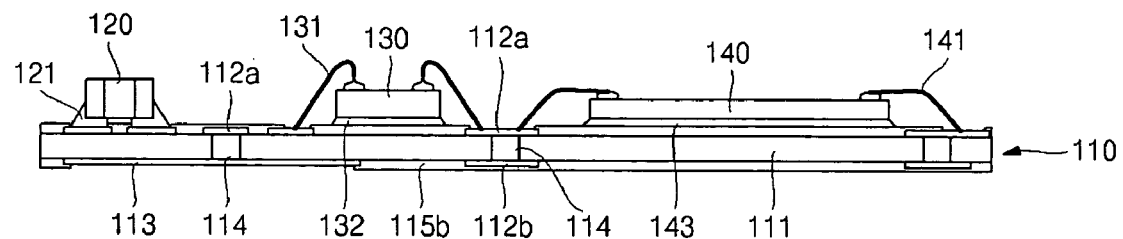
Figure 9C:
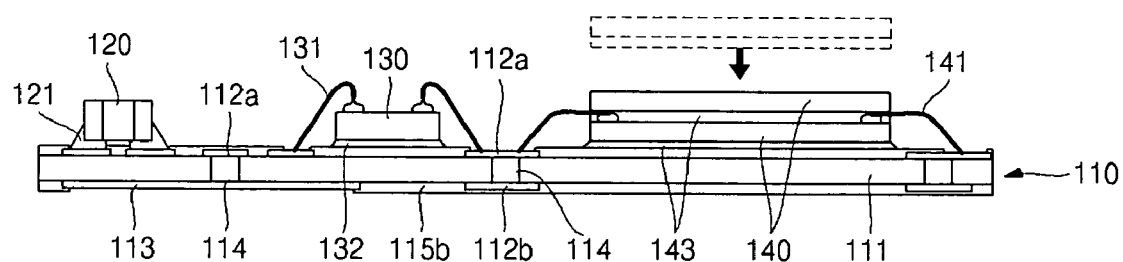

FIGS. 9a to 9c are schematic views illustrating a wire bonding method using the forward folded loop mode process among methods for manufacturing the micro USB memory package 401 according to the present invention.

As shown in FIG. 9a, the controllers 130 and the flash memories 140 are bonded to the top surface of the substrate 110.

Thereafter, as shown in FIG. 9b, the controllers 130 and the substrate 110 are electrically interconnected by the wire 131 using the typical forward loop mode process, and the flash memories 140 and the substrate 110 are electrically interconnected by the wire 141 using the forward folded loop mode process. That is, one end of the wire 131 is firstly ball-bonded to the controllers 130 and the other end of the wire is secondly stitch-bonded to the circuit patterns 112a, and thus the controllers 130 and the substrate 110 are electrically interconnected. Thereafter, one end of the wire 141 is firstly ball-bonded to the flash memories 140 and then is outwardly folded to minimize the loop height, and the other end of the wire is secondly stitch-bonded to the circuit patterns 112a. In doing so, the loop height of the wire 141 formed on the flash memories 140 is minimized.

Of course, after these wire bonding operations, a further flash memory 140, which is provided on the under surface thereof with the adhesive (adhesive film) 143, is stacked, and then wire bonding operations using the forward folded loop mode process are performed sequentially as shown in FIG. 9c.

According to the forward folded loop mode process, the wire bonding operations can be completed by properly controlling only the capillary track of the wire bonder without employing a separate structure or method. Accordingly, there is an advantageous effect that the manufacturing cost is reduced when stacking the plurality of flash memories 140.

FIGS. 10*a* to 10*d* are schematic views illustrating a wire bonding method using the reverse loop mode process among methods for manufacturing the micro USB memory package 401 and 402 according to the present invention.

Figure 10A:
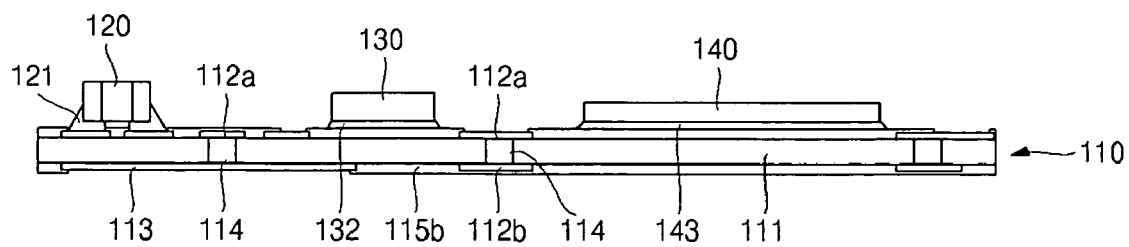
FIGS. 10a to 10d are schematic views illustrating a wire bonding method using a reverse loop mode process among methods for manufacturing a micro USB memory package according to the present invention.

As shown in FIG. 10*a*, the controllers 130 and the flash memories 140 are bonded to the top surface of the substrate 110.

Figure 10B:
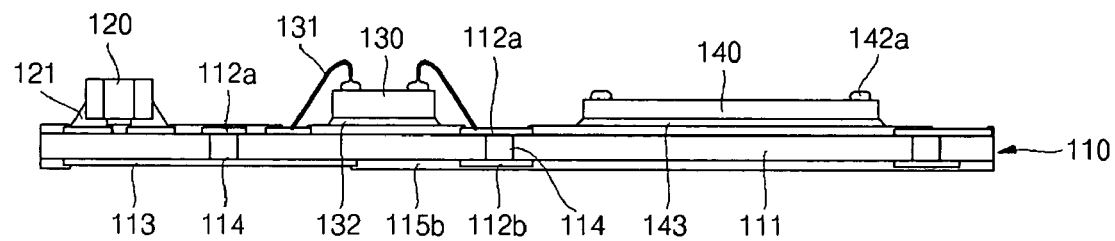

Thereafter, as shown in FIG. 10*b*, the controllers 130 and the substrate 110 are electrically interconnected by the wire 131 using the typical normal wire bonding method, and the conducting bump 142*a* is preformed on the flash memories 140 for the reverse loop mode process. The conducting bump 142*a* can be formed by several methods, and, for example, a solder bump or an Au plated bump is formed in a wafer state. Otherwise, a stud bump can be formed using the capillary of the wire bonder. There is illustrated in the drawing a stud bump formed by using the wire and capillary as the conducting bump 142*a*.

Figure 10C:
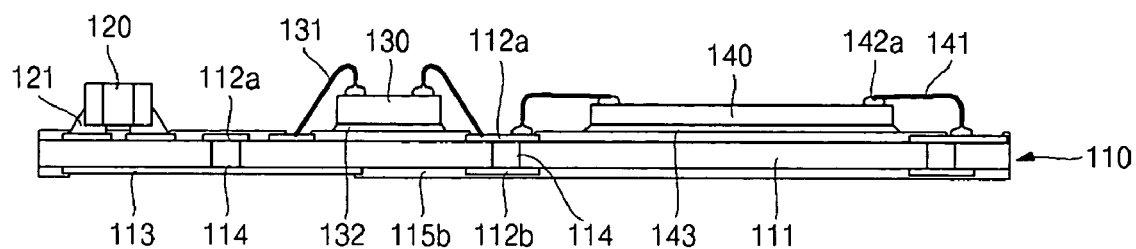

Thereafter, as shown in FIG. 10*c*, one end of the wire is firstly ball-bonded to the circuit patterns 112*a* of the substrate 110, and the other end of the wire is secondly stitch-bonded to the conducting bump 142*a* preformed on the flash memories 140. That is, the wire bonding operations are performed by using the reverse loop mode process.

Figure 10D:
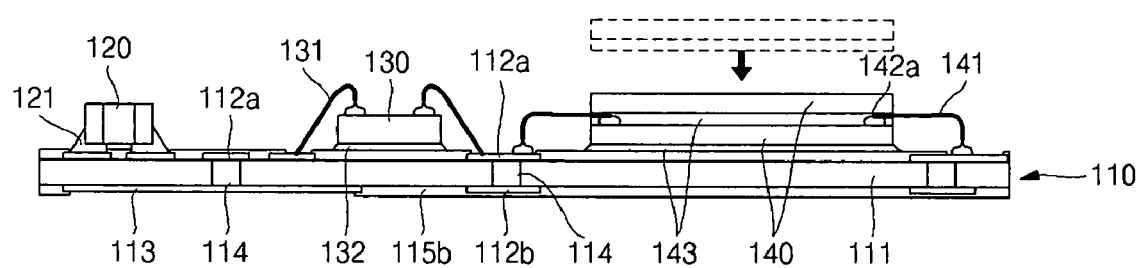

Similarly, after these wire bonding operations, a further flash memory 140, which is provided on the under surface thereof with the adhesive 143 (adhesive film), is stacked, and then wire bonding operations are performed sequentially by using the reverse loop mode process as shown in FIG. 10*d*.

According to the reverse loop mode process, the manufacturing cost tends to be increased, but the reliability and the workability are improved.

According to the present invention, there is an advantageous effect that new USB lands meeting the USB standard specification are formed on the under surface of the substrate instead of removing the conventional USB plug coupled with the USB receptacle, and various kinds of elements (the passive elements, the controllers and the flash memories) can be mounted on the top surface of the substrate corresponding to the USB lands, and thus there is provided a micro USB memory package having much lighter, thinner, shorter and smaller configuration than that of the prior art.

Furthermore, according to the present invention, there is an advantageous effect that the controllers and the flash memories are electrically connected with the substrate not in the form of a package but in the form of a die and an encapsulation technology using a stack technology, a wire bonding technology and the encapsulant is employed, and thus there is provided a micro USB memory package enabling to easily expand the memory capacity and simplify the manufacturing method thereof.

Furthermore, according to the present invention, there is an advantageous effect that the LED element indicating the operating state is mounted on the substrate and is encapsulated together with other elements by the transparent encapsulant, and thus there is provided a micro USB memory package enabling to easily see the operating state from the outside and actively prevent the penetration of moisture or foreign substance.

Furthermore, according to the present invention, there is an advantageous effect that USB lands meeting the USB standard specification are symmetrically formed and arranged on the under surface of the substrate, and thus there is provided a micro USB memory package enabling to be normally used whichever directions the micro USB memory package is coupled with the receptacle.

Furthermore, according to the present invention, there is an advantageous effect that the external case almost covering the substrate and the encapsulation part is further provided, and thus a micro USB memory package enabling to protect more safely from the external mechanical, electrical and chemical environment.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A micro USB memory package comprising:
   a substrate with a plurality of circuit patterns formed on a top surface thereof;
   at least one of passive elements connected with the circuit patterns of the substrate;
   at least one of controllers connected with the circuit patterns of the substrate;
   at least one of flash memories connected with the circuit patterns of the substrate; and
   an encapsulation part encapsulating the passive elements, the controllers and the flash memories on the top surface of the substrate;
   wherein at least one of USB lands connected with the circuit patterns by a conducting via is formed on an under surface of one side of the substrate, and wherein at least one of further USB lands are additionally formed on the under surface of the opposite side from where the at least one of USB lands are formed, and wherein the USB lands formed on one side and the USB lands formed on the opposite side are arranged in reverse order with respect to each other, and both USB lands are interconnected by the circuit patterns and the conducting via, and wherein all side surfaces between the top surface and the under surface of the substrate are exposed to the outside, and wherein the encapsulation part is in contact with the at least one of passive elements, the at least one of controllers, the at least one of flash memories and the top surface of the substrate; and
   wherein the substrate and the encapsulation part provide a thickness such that the USB lands engage a USB port without an external case.

2. The micro USB memory package as claimed in claim 1, wherein at least one of the passive elements, the controllers or the flash memories is connected with the circuit patterns on the top surface corresponding to the USB lands of the substrate.

3. The micro USB memory package as claimed in claim 1, wherein an LED element is further connected with the circuit patterns of the substrate.

4. The micro USB memory package as claimed in claim 3, wherein the encapsulation part is formed of transparent material so as to see the LED element from the outside.

5. The micro USB memory package as claimed in claim 1, wherein the at least one controllers are attached to the substrate by an adhesive and are connected with the circuit patterns of the top surface of the substrate by a wire.

6. The micro USB memory package as claimed in claim 1, wherein the at least one flash memories are attached to the substrate by an adhesive and are connected with the circuit patterns of the top surface of the substrate by a wire.

7. The micro USB memory package as claimed in claim 6, wherein at least two of the flash memories are stacked by the adhesive.

8. The micro USB memory package as claimed in claim 6, wherein the wire connecting the flash memories with the circuit patterns is formed by a forward loop mode process or a forward folded loop mode process in which one end of the wire is firstly ball-bonded to the flash memories and the other end of the wire is secondly stitch-bonded to the circuit patterns.

9. The micro USB memory package as claimed in claim 6, wherein the wire connecting the flash memories with the circuit patterns is formed by a reverse loop mode process in which one end of the wire is firstly ball-bonded to the circuit patterns and the other end of the wire is secondly stitch-bonded to a conducting bump (stud bump) preformed on the flash memories.

10. A micro USB memory package comprising:

a substrate with a plurality of circuit patterns formed on a top surface thereof, at least one of passive elements connected with the circuit patterns of the substrate;

at least one of controllers connected with the circuit patterns of the substrate;

at least one of flash memories connected with the circuit patterns of the substrate; and an encapsulation part encapsulating the passive elements, the controllers and the flash memories on the top surface of the substrate;

wherein at least one of USB lands connected with the circuit patterns by a conducting via is formed on an under surface of one side of the substrate, and wherein all side surfaces between the top surface and the under surface of the substrate are exposed to the outside, and wherein the encapsulation part is in contact with the at least one of passive elements, the at least one of controllers, the at least one of flash memories and the top surface of the substrate; and wherein the substrate and the encapsulation part provide a thickness such that the USB lands engage a USB port without an external case.

11. The micro USB memory package as claimed in claim 10, wherein the at least one flash memories are attached to the substrate by an adhesive and are connected with the circuit patterns of the top surface of the substrate by a wire.

12. The micro USB memory package as claimed in claim 10, wherein at least two of the flash memories are stacked by the adhesive.

* * * * *